US011768663B1

(12) United States Patent
Tiwary et al.

(10) Patent No.: US 11,768,663 B1
(45) Date of Patent: Sep. 26, 2023

(54) COMPACTION OF MULTIPLIER AND ADDER CIRCUITS

(71) Applicant: Xilinx, Inc., San Jose, CA (US)

(72) Inventors: Srijan Tiwary, Hyderabad (IN); Aman Gayasen, Hyderabad (IN)

(73) Assignee: XILINX, INC., San Jose, CA (US)

( * ) Notice: Subject to any disclaimer, the term of this patent is extended or adjusted under 35 U.S.C. 154(b) by 511 days.

(21) Appl. No.: 17/014,410

(22) Filed: Sep. 8, 2020

(51) Int. Cl.
*G06F 7/506* (2006.01)
*G06F 30/327* (2020.01)
*G06F 30/34* (2020.01)
*G06F 7/533* (2006.01)
*G06F 7/57* (2006.01)

(52) U.S. Cl.
CPC ............ *G06F 7/5334* (2013.01); *G06F 7/506* (2013.01); *G06F 7/57* (2013.01); *G06F 30/327* (2020.01); *G06F 30/34* (2020.01)

(58) Field of Classification Search
CPC ................... G06F 30/327; G06F 30/34; G06F 30/343–347; G06F 30/373; G06F 7/506; G06F 7/5334; G06F 7/57
See application file for complete search history.

(56) References Cited

U.S. PATENT DOCUMENTS

| 7,274,211 | B1 | 9/2007 | Simkins et al. |
| 7,627,458 | B1 * | 12/2009 | Van Mau ............... G06F 30/327 716/132 |
| 7,913,203 | B1 * | 3/2011 | Perry .................... G06F 30/327 716/108 |
| 9,237,257 | B1 | 1/2016 | Szedo et al. |
| 9,455,714 | B1 | 9/2016 | Gaide |
| 9,916,131 | B2 * | 3/2018 | Walters, III ............. G06F 7/501 |

OTHER PUBLICATIONS

H. Parandeh-Afshar and P. Ienne, "Measuring and Reducing the Performance Gap between Embedded and Soft Multipliers on FPGAs," in International Conference on Field Programmable Logic and Applications (FPL), IEEE, pp. 225-231, 2011 (Year: 2011).*
M. Kumm, S. Abbas and P. Zipf, "An Efficient Softcore Multiplier Architecture for Xilinx FPGAs," 2015 IEEE 22nd Symposium on Computer Arithmetic, pp. 18-25, 2015 (Year: 2015).*

(Continued)

*Primary Examiner* — Matthew D Sandifer
(74) *Attorney, Agent, or Firm* — Crawford Maunu PLLC

(57) ABSTRACT

Approaches for logic compaction include inputting an optimization directive that specifies one of area optimization or speed optimization to a synthesis tool executing on a computer processor. The synthesis tool identifies a multiplier and/or an adder specified in a circuit design and synthesizing the multiplier into logic having LUT-to-LUT connections between LUTs on separate slices of a programmable integrated circuit (IC) in response to the optimization directive specifying speed optimization. The synthesis tool synthesizes the multiplier and/or adder into logic having LUT-carry connections between LUTs and carry logic within a single slice of the programmable IC in response to the optimization directive specifying area optimization. The method includes implementing a circuit on the programmable IC from the logic having LUT-carry connections in response to the optimization directive specifying area optimization.

20 Claims, 13 Drawing Sheets

(56) References Cited

OTHER PUBLICATIONS

S. Ullah et al., "Area-Optimized Low-Latency Approximate Multipliers for FPGA-based Hardware Accelerators," 2018 55th ACM/ESDA/IEEE Design Automation Conference (DAC), pp. 1-6, 2018 (Year: 2018).*

Intel, "Intel FPGA Integer Arithmetic IP Cores User Guide", UG-01063, version Oct. 5, 2020, retrieved from https://www.intel.com/content/www/us/en/docs/programmable/683490/20-3/intel-fpga-integer-arithmetic-ip-cores.html (Year: 2020).*

Xilinx, "Multiplier v12.0", LogiCore IP Product Guide, PG108, 2015, retrieved from https://docs.xilinx.com/v/u/en-US/pg108-mult-gen (Year: 2015).*

Martin Langhammer, Fractal Synthesis, FPGA '19, Feb. 24-26, 2019, pp. 202-211, Seaside, CA, USA.

Martin Langhammer, High Density and Performance Multiplication for FPGA, 25th IEEE Symposium on Computer Arithmetic, 2018, pp. 5-12.

\* cited by examiner

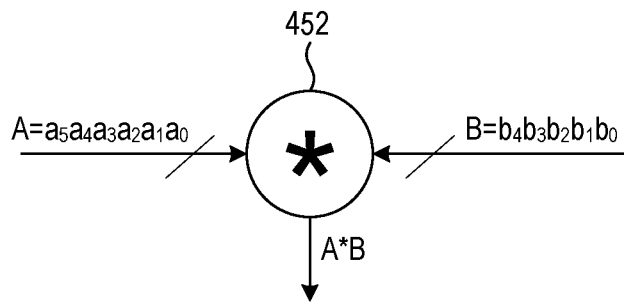

FIG. 7

|  |  |  |  |  |  |  |  |  |  |  |
|---|---|---|---|---|---|---|---|---|---|---|
|  |  | $a_5 \cdot b_0$ | $a_4 \cdot b_0$ | $a_3 \cdot b_0$ | $a_2 \cdot b_0$ | $a_1 \cdot b_0$ | $a_0 \cdot b_0$ |  |  | PP1 |
|  | $a_5 \cdot b_1$ | $a_4 \cdot b_1$ | $a_3 \cdot b_1$ | $a_2 \cdot b_1$ | $a_1 \cdot b_1$ | $a_0 \cdot b_1$ | 0 |  |  | PP2 |
|  | $a_5 \cdot b_2$ | $a_4 \cdot b_2$ | $a_3 \cdot b_2$ | $a_2 \cdot b_2$ | $a_1 \cdot b_2$ | $a_0 \cdot b_2$ | 0 | 0 |  | PP3 |
|  | $a_5 \cdot b_3$ | $a_4 \cdot b_3$ | $a_3 \cdot b_3$ | $a_2 \cdot b_3$ | $a_1 \cdot b_3$ | $a_0 \cdot b_3$ | 0 | 0 | 0 | PP4 |
| + | $a_5 \cdot b_4$ | $a_4 \cdot b_4$ | $a_3 \cdot b_4$ | $a_2 \cdot b_4$ | $a_1 \cdot b_4$ | $a_0 \cdot b_4$ | 0 | 0 | 0 | 0 | PP5 |
| $p_9$ | $p_8$ | $p_7$ | $p_6$ | $p_5$ | $p_4$ | $p_3$ | $p_2$ | $p_1$ | $p_0$ |  |

FIG. 8

COMPACTION OF MULTIPLIER AND ADDER CIRCUITS

TECHNICAL FIELD

The disclosure generally relates to compaction of multiplier and adder circuits.

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Implementation of low-precision arithmetic circuits, such as multipliers and adders, in FPGA resources is increasing dramatically with the growth of machine learning applications. However, FPGAs have limited numbers of DSPs, which makes mapping large numbers of low-precision arithmetic circuits to DSPs on a device infeasible.

SUMMARY

A disclosed method includes inputting an optimization directive that specifies one of area optimization or speed optimization to a synthesis tool executing on a computer processor. The method includes identifying by the synthesis tool, a multiplier and/or an adder specified in a circuit design. The method includes synthesizing the multiplier and/or adder by the synthesis tool into logic having LUT-to-LUT connections between LUTs on separate slices of a programmable integrated circuit (IC) in response to the optimization directive specifying speed optimization. A LUT is a look-up table. The method includes synthesizing the multiplier and/or adder by the synthesis tool into logic having LUT-carry connections between LUTs and carry logic within a single slice of the programmable IC in response to the optimization directive specifying area optimization. The method includes implementing a circuit on the programmable IC from the logic having LUT-carry connections in response to the optimization directive specifying area optimization.

A disclosed system includes one or more processors and a memory arrangement configured with instructions of a synthesis tool. Execution of the instructions cause the one or more processors to perform operations including inputting an optimization directive that specifies one of area optimization or speed optimization and identifying a multiplier and/or an adder specified in a circuit design. In executing the instructions, the one or more processors synthesize the multiplier and/or adder into logic having LUT-to-LUT connections between LUTs on separate slices of a programmable integrated circuit (IC) in response to the optimization directive specifying speed optimization, wherein a LUT is a look-up table. The one or more processors in executing the instructions synthesize the multiplier and/or adder into logic having LUT-carry connections between LUTs and carry logic within a single slice of the programmable IC in response to the optimization directive specifying area optimization. Execution of the instructions cause the one or more processors to implement a circuit on the programmable IC from the logic having LUT-carry connections in response to the optimization directive specifying area optimization.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which:

FIG. 7 shows an example of a multiplier;

FIG. 8 shows rows of partial products generated from the bits of factors A and B of FIG. 7 and the summation of the partial products;

DETAILED DESCRIPTION

Figure 1:
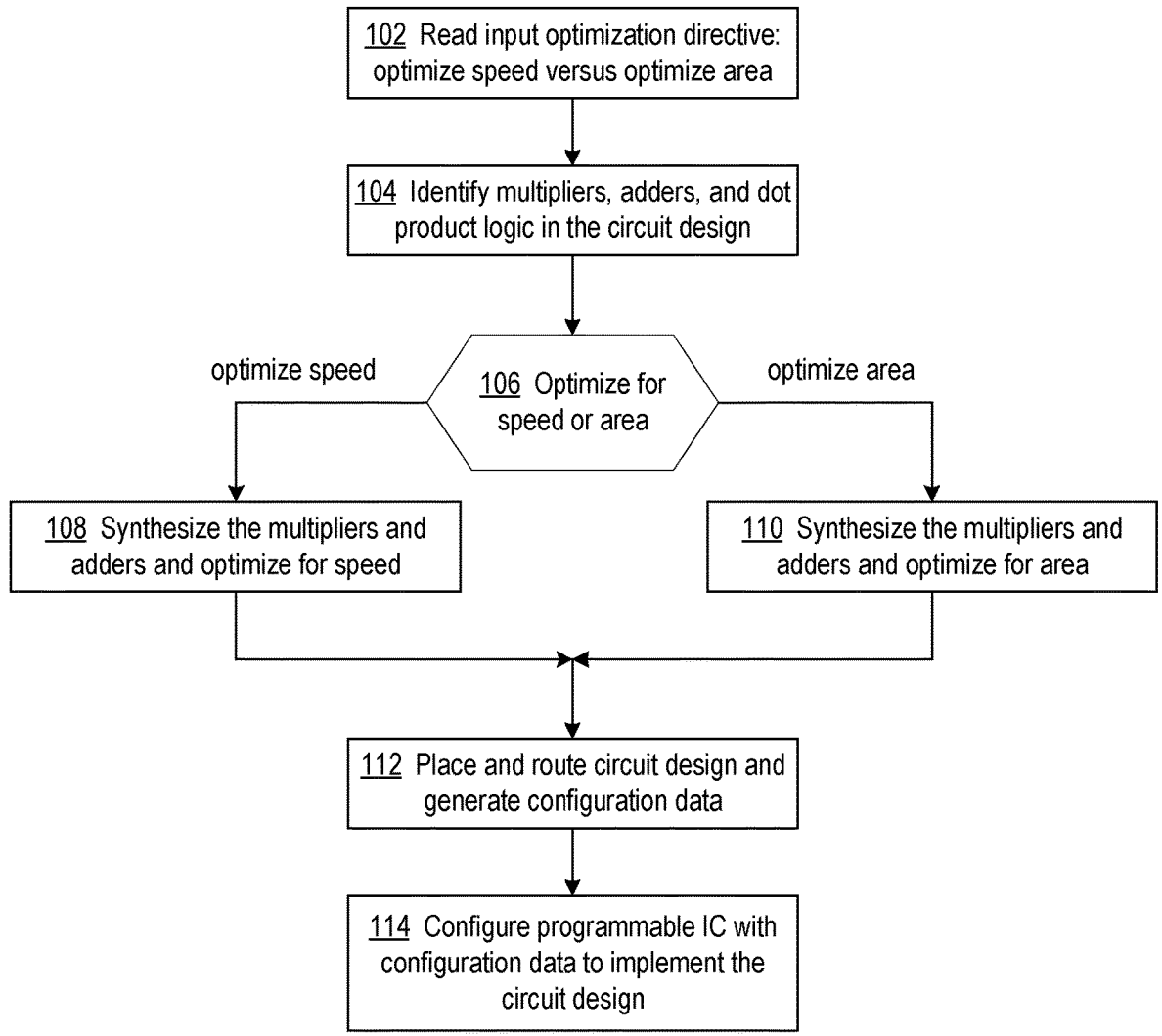
FIG. 1 is a flowchart of an exemplary process of making a circuit having multipliers and adders and providing options for optimizing the circuitry for speed or area.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Machine learning (ML) applications involve many dot-product operations, which can be performed by large numbers of multipliers and adders implemented as circuits on an FPGA. The throughput of an ML application can depend on the number of multipliers and adders that can be instantiated on an FPGA. Conventional synthesis algorithms attempt to optimize timing of multipliers and adders, which can result in occupation of a large portion of the FPGA resources by multipliers and adders and lead to congestion and timing challenges for other application circuitry.

The disclosed approaches provide circuit designers with the ability to optionally optimize multipliers and adders for circuit area instead of speed. For ML applications, for example, a designer can control an electronic design automation (EDA) design tool to recognize multiplier and adder logic and optimize the quantity of FPGA resources used in the circuit implementation. For example, instead of optimizing timing of the circuit by implementing LUT-to-LUT connections between different slices (e.g., FIGS. 3 and 4), the disclosed approaches implement more regular circuit structures having LUT-CARRY-LUT-CARRY paths (e.g., FIG. 5). The disclosed approaches are especially useful in applications that involve a large number of small bit-width multipliers, such as those that implement a dot product function. The disclosed approaches can pack a greater number of multipliers on the same device than would conventional approaches, thereby improving processing throughput of the design.

According to the disclosed approaches, a synthesis tool of an EDA suite inputs an optimization directive to be used in processing a circuit design. The optimization directive can specify one of area optimization or speed optimization. The synthesis tool identifies multipliers in the circuit design and synthesizes the multipliers according to the directive. In response to the optimization directive specifying speed optimization, the synthesis tool synthesizes the multiplier into logic having LUT-to-LUT connections between LUTs on separate slices of a programmable integrated circuit (IC). In response to the optimization directive specifying area optimization, which directs logic compaction, the synthesis tool synthesizes the multiplier into logic having LUT-carry connections between LUTs and carry logic within a single slice of the programmable IC. After synthesis, a circuit is implemented on the programmable IC from the logic having LUT-carry connections in response to the optimization directive specifying area optimization.

FIG. 1 is a flowchart of an exemplary process of making a circuit having multipliers and adders and providing options for optimizing the circuitry for speed or area. At block 102, the synthesis tool inputs an optimization directive as specified by the circuit designer. The optimization directive can direct the synthesis tool to optimize for speed (clock frequency) or for semiconductor die area ("logic compaction"). The area optimization directive can direct the tool to apply the area optimization to the entire circuit design ("global"), to individually specified logic blocks or modules, or to individual instances of logic blocks or modules.

At block 104 the synthesis tool identifies multipliers, ternary adders, and dot product logic specified in a circuit design in response to the optimization directive specifying area optimization. At decision block 106, the synthesis tool determines whether the optimization directive specifies speed or area optimization. In response to the optimization directive specifying speed optimization, the synthesis tool at block 108 synthesizes the multipliers and adders into logic having LUT-to-LUT connections between LUTs on separate slices of a programmable integrated circuit (IC).

In response to the optimization directive specifying area optimization, at block 110 the synthesis tool synthesizes multiplier(s) by into logic having LUT-carry connections between LUTs and carry logic within a single slice of the programmable IC. The multipliers of dot product logic are similarly synthesized. For dot product logic, the synthesizer tool also sorts and connects partial products of the multipliers to an adder tree.

At block 110, the synthesis also optimizes ternary adders identified at block 104 according to the optimization directive. The synthesis tool identifies pairs of LUTs that share the same inputs and perform addition of the ternary adder, and then merges each pair of LUTs into a single six-input LUT having dual outputs, according to known synthesis algorithms. The merging of two LUTs into a single LUT can reduce design area but reduce design speed. In response to the optimization directive specifying area optimization, the synthesis tool un-pairs the paired LUTs. In response to the optimization directive specifying speed optimization, the synthesis tool leaves the LUT pairs intact.

At block 112, the netlist is placed-and-routed at block 508 by place-and-route tools, and bitstream generation tools can be executed to generate configuration data for an FPGA from the synthesized multipliers and adders from the processing of blocks 108 and/or 110. At block 114, known device programming tools can be operated to configure a programmable IC with the configuration data, thereby creating a circuit that operates according to the optimized circuit design. For example, in response to the optimization directive specifying area optimization the implemented circuit can have LUT-carry connections for area-optimized multipliers and intact LUT pairs for area-optimized ternary adders.

Figure 2:
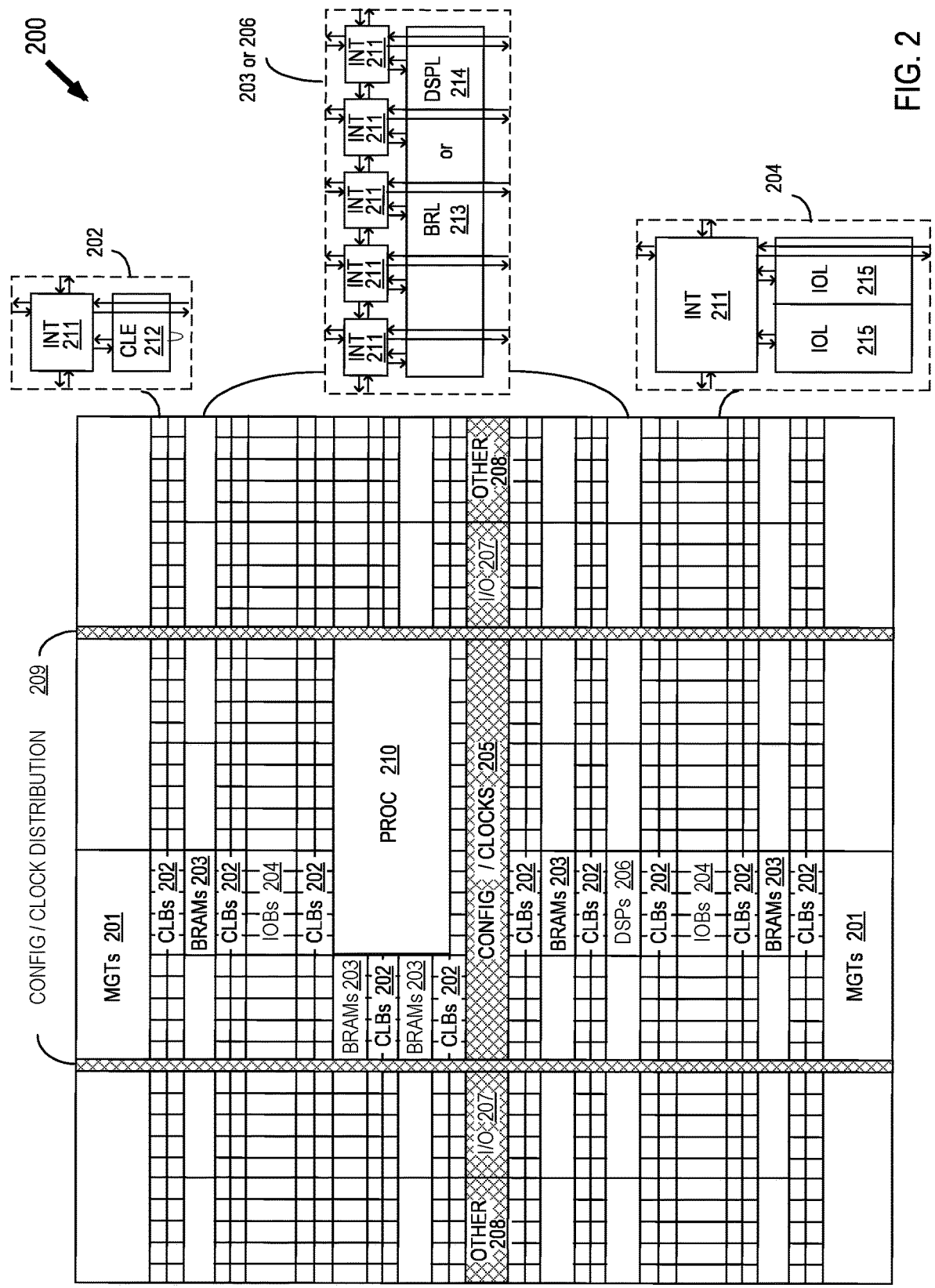
FIG. 2 shows a programmable integrated circuit (IC) on which the optimized circuits can be implemented.

FIG. 2 shows a programmable integrated circuit (IC) 200 on which the optimized circuits can be implemented. The programmable IC may also be referred to as a System On Chip (SOC) that includes field programmable gate array logic (FPGA) along with other programmable resources. FPGA logic may include several different types of programmable logic blocks in the array. For example, FIG. 2 illustrates programmable IC 200 that includes a large number of different programmable tiles including multi-gigabit transceivers (MGTs) 201, configurable logic blocks (CLBs) 202, random access memory blocks (BRAMs) 203, input/ output blocks (IOBs) 204, configuration and clocking logic (CONFIG/CLOCKS) 205, digital signal processing blocks (DSPs) 206, specialized input/output blocks (I/O) 207, for example, clock ports, and other programmable logic 208 such as digital clock managers, analog-to-digital converters, system monitoring logic, and so forth. Some programmable IC having FPGA logic also include dedicated processor blocks (PROC) 210 and internal and external reconfiguration ports (not shown). Circuit designs processed according to the disclosed methods and systems can also be implemented as ASICs or on an adaptive compute acceleration platform (ACAP). An ACAP has FPGA fabric with distributed memory and hardware-programmable DSP blocks, a multicore SoC, and one or more software programmable, yet hardware adaptable, compute engines, all connected through a network on chip (NoC).

In some FPGA logic, each programmable tile includes a programmable interconnect element (INT) 211 having standardized connections to and from a corresponding interconnect element in each adjacent tile. Therefore, the programmable interconnect elements taken together implement the programmable interconnect structure for the illustrated FPGA logic. The programmable interconnect element INT 211 also includes the connections to and from the programmable logic element within the same tile, as shown by the examples included at the top of FIG. 2.

For example, a CLB 202 can include a configurable logic element CLE 212 that can be programmed to implement user logic, plus a single programmable interconnect element INT 211. A BRAM 203 can include a BRAM logic element (BRL) 213 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 206 can include a DSP logic element (DSPL) 214 in addition to an appropriate number of programmable interconnect elements. An 10B 204 can include, for example, two instances of an input/output logic element (IOL) 215 in addition to one instance of the programmable interconnect element INT 211. As will be clear to those of skill in the art, the actual I/O bond pads connected, for example, to the I/O logic element 215, are manufactured using metal layered above the various illustrated logic blocks, and typically are not confined to the area of the input/output logic element 215.

A columnar area near the center of the die (shown shaded in FIG. 2) is used for configuration, clock, and other control logic. Horizontal areas 209 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 2 include additional logic blocks that disrupt the regular columnar structure making up a large part of the programmable IC. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual programmable IC, more than one adjacent column of CLBs is typically included wherever the CLBs appear, to facilitate the efficient implementation of user logic.

Figure 3:
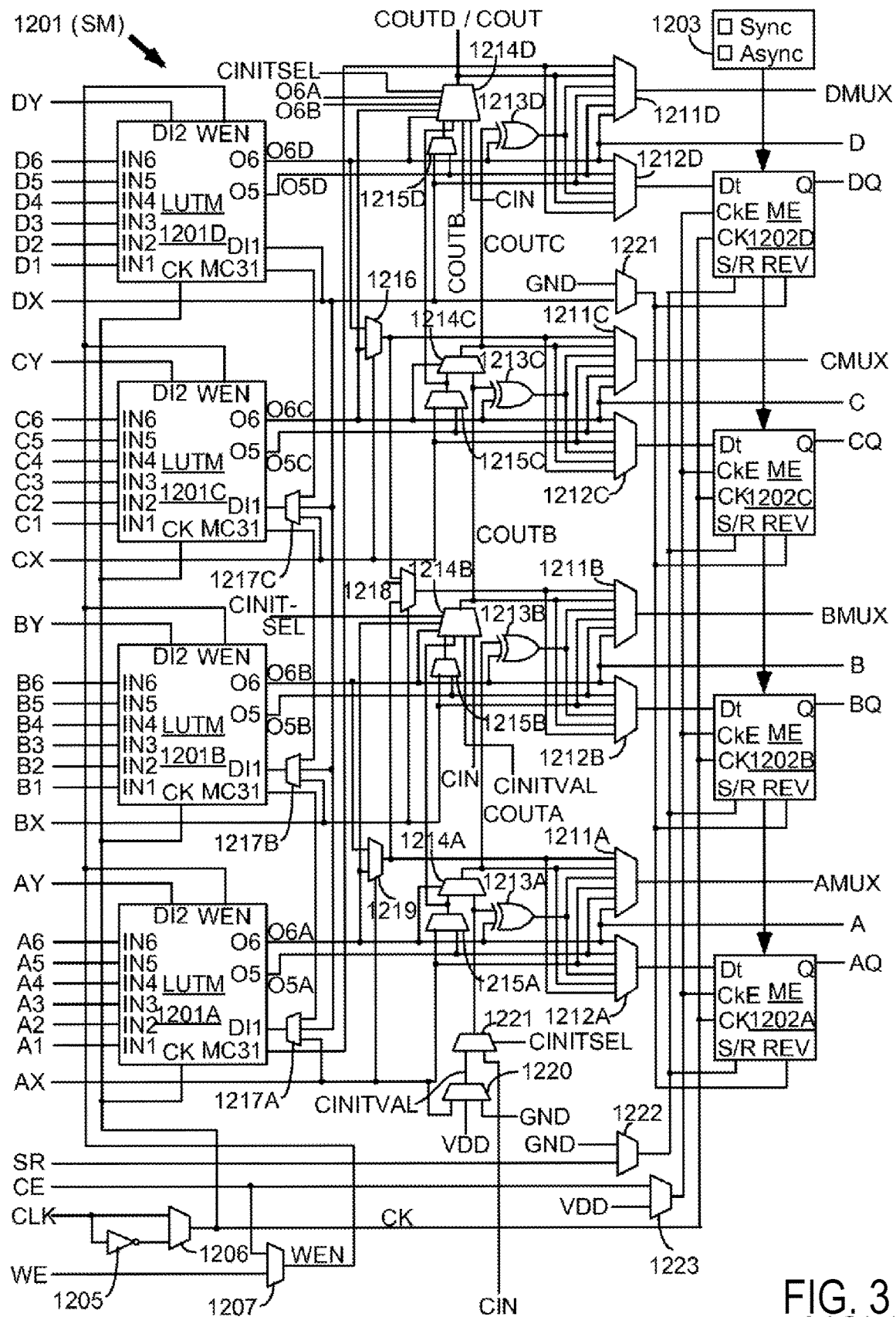
FIG. 3 shows a block diagram of a configurable logic element of the device of FIG. 2.

FIG. 3 shows a block diagram of a configurable logic element of the device of FIG. 2. In particular, FIG. 3 illustrates in simplified form a configurable logic element of a configuration logic block 1102 of FIG. 2. In the embodiment of FIG. 3, slice M 1201 includes four lookup tables (LUTMs) 1201A-1201D, each driven by six LUT data input terminals A1-A6, B1-B6, C1-C6, and D1-D6 and each providing two LUT output signals O5 and O6. The O6 output terminals from LUTs 1201A-1201D drive slice output terminals A-D, respectively. The LUT data input signals are supplied by the FPGA interconnect structure via input multiplexers, which may be implemented by programmable interconnect element 1211, and the LUT output signals are also supplied to the interconnect structure. Slice M also includes: output select multiplexers 1211A-1211D driving output terminals AMUX-DMUX; multiplexers 1212A-1212D driving the data input terminals of memory elements 1202A-1202D; combinational multiplexers 1216, 1218, and 1219; bounce multiplexer circuits 1222-1223; a circuit represented by inverter 1205 and multiplexer 1206 (which together provide an optional inversion on the input clock path); and carry logic having multiplexers 1214A-1214D, 1215A-1215D, 1220-1221 and exclusive OR gates 1213A-1213D. All of these elements are coupled together as shown in FIG. 3. Where select inputs are not shown for the multiplexers illustrated in FIG. 3, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 3 for clarity, as well as from other selected figures herein.

In the pictured embodiment, each memory element 1202A-1202D may be programmed to function as a synchronous or asynchronous flip-flop or latch. The selection between synchronous and asynchronous functionality is made for all four memory elements in a slice by programming Sync/Asynch selection circuit 1203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1202A-1202D are clocked by a clock signal CK, which may be provided by a global clock network or by the interconnect structure, for example. Such programmable memory elements are well known in the art of FPGA design. Each memory element 1202A-1202D provides a registered output signal AQ-DQ to the interconnect structure. Because each LUT 1201A-1201D provides two output signals, O5 and O6, the LUT may be configured to function as two 5-input LUTs with five shared input signals (IN1-IN5), or as one 6-input LUT having input signals IN1-IN6.

In the embodiment of FIG. 3, each LUTM 1201A-1201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1217A-1217C for LUTs 1201A-1201C), or to the two 32-bit RAMs via input terminals DI1 and DI2. RAM write operations in the LUT RAMs are controlled by clock signal CK from multiplexer 1206 and by write enable signal WEN from multiplexer 1207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1201A may also be provided to the general interconnect structure for shift register chaining, via output select multiplexer 1211D and CLE output terminal DMUX. Accordingly, the circuits and methods set forth above may be implemented in a device such as the device of FIG. 2 or any other suitable device.

Figure 4:
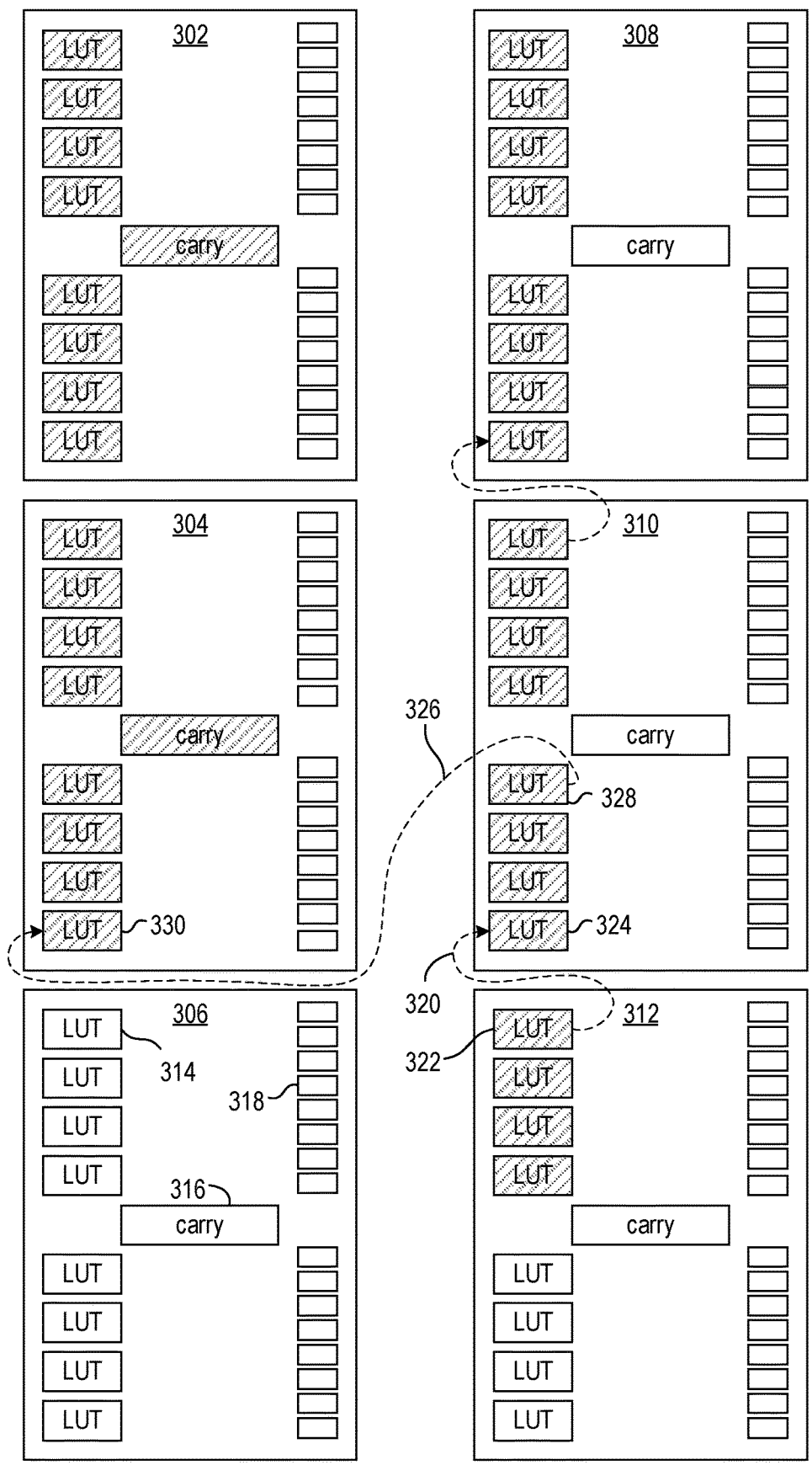
FIG. 4 shows slices of a portion of an FPGA and an exemplary layout of a speed-optimized multiplier having connections between LUTs in different slices (LUT-to-LUT connections)

FIG. 4 shows slices of a portion of an FPGA and an exemplary layout of a speed-optimized multiplier having connections between LUTs in different slices (LUT-to-LUT connections). The slices include slices 302, 304, 306, 308, 310, and 312. Each slice includes multiple LUTs, carry logic, and output registers. For example, LUT 314, carry logic 316, and register 318 are programmable resources of slice 306.

The circuit that implements the multiplier consumes five slices (302, 304, 308, 310, and 312). The resources of each slice that are used to implement the multiplier are shown as blocks having diagonal fill lines. For example, all of the LUTs, and the carry logic of slice 302 are used in the implementation of the multiplier.

The circuits within one slice can be communicatively coupled to circuits within one or more others of the slices by programmable routing circuits (not shown). The circuitry that implements the multiplier, having been optimized for speed, has LUT-to-LUT connections between LUTs of different slices. For example, dashed line 320 represents the connection of LUT 322 of slice 312 to LUT 324 of slice 310 via programmable routing circuitry between the slices. Similarly, dashed line 326 represents the connection of LUT 328 of slice 310 to LUT 330 of slice 304.

Notably, the use of resources of slices 302, 304, 308, 310, and 312 to implement the multiplier is suboptimal in terms of area as the implemented circuit uses the LUTs of slices 308, 310, and 312 but does not use the carry logic of those slices.

Figure 5:
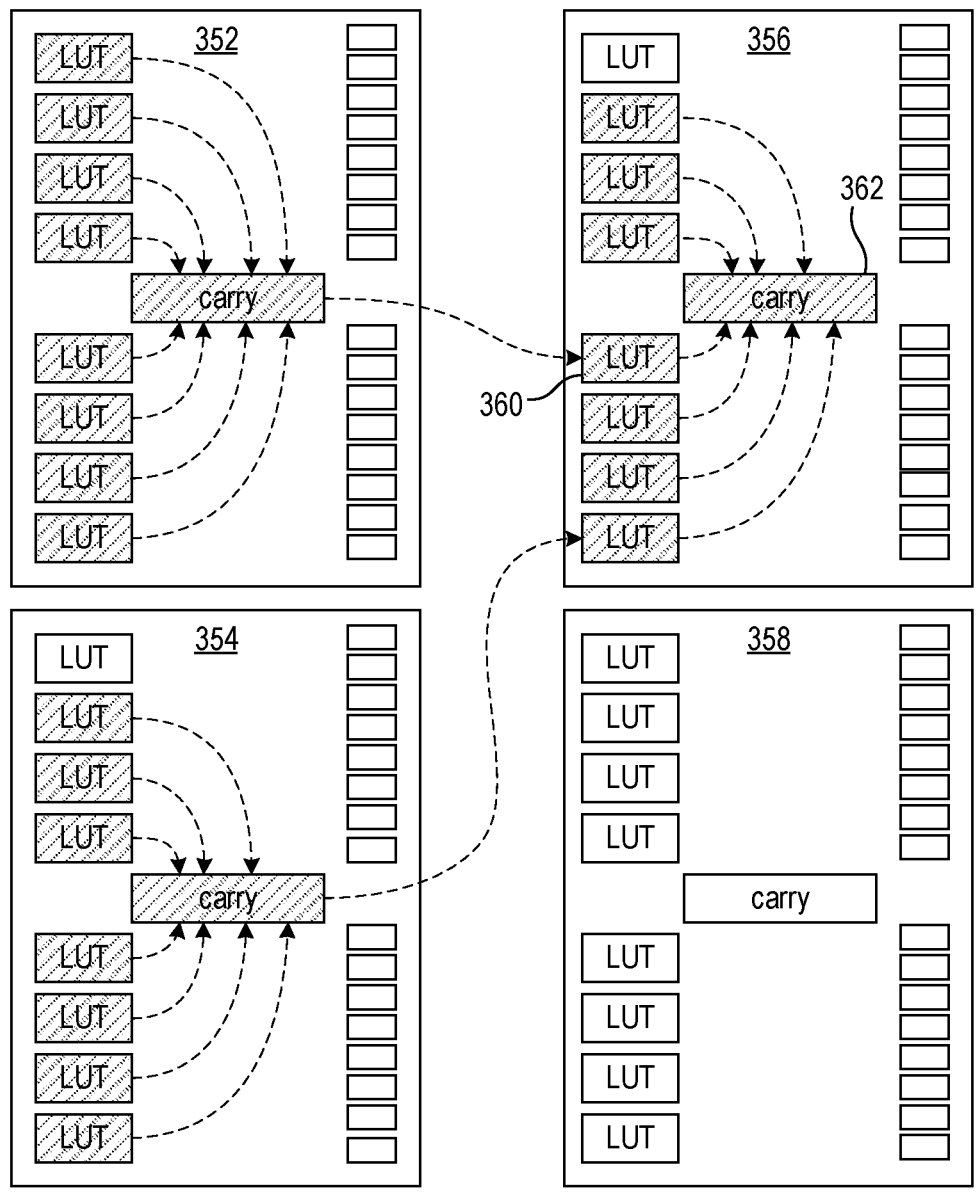
FIG. 5 shows slices of a portion of an FPGA and an exemplary layout of a multiplier in which the implementation has connections between LUTs and carry logic in the same slice (LUT-to-carry connections) as a result of optimizing for area.

FIG. 5 shows slices of a portion of an FPGA and an exemplary layout of a multiplier in which the implementation has connections between LUTs and carry logic in the same slice (LUT-to-carry connections) as a result of optimizing for area. The multiplier of FIG. 5 is functionally equivalent to the multiplier of FIG. 4. In optimizing a multiplier for area, the disclosed approaches seek to avoid creating LUT-to-LUT connections between different slices and instead employ slice-local carry logic for ternary and binary adders to sum partial products.

The exemplary slices include slices 352, 354, 356, and 358. The circuit that implements the multiplier occupies three slices 352, 354, and 356, as compared to the five-slice implementation of FIG. 4.

The implementation of the multiplier creates LUT-carry-LUT connections in order to make efficient use of slice resources. For example, the LUTs of slice 352 are connected to the carry logic of slice 352, as represented by the dashed lines, and the carry logic of slice 352 is connected to LUT 360 of slice 356. The final output of the multiplier is output from carry logic 362 of slice 356.

Figure 6:
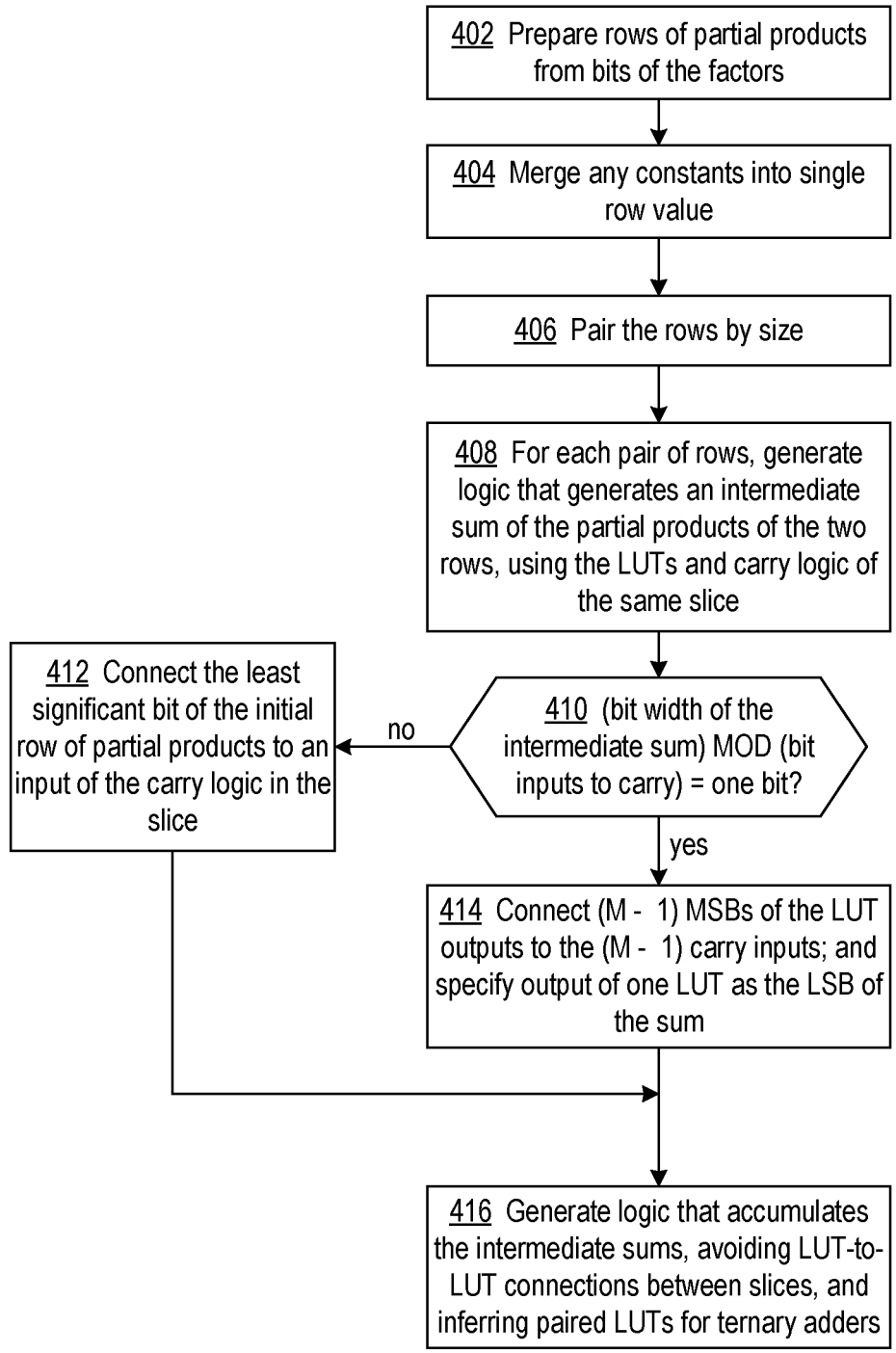
FIG. 6 shows a flowchart of a process of area-optimization of multipliers and adders of a circuit design.

FIG. 6 shows a flowchart of a process of area-optimization of multipliers and adders of a circuit design. The synthesizer tool reduces the multiplier into partial products that sum to the product of the input factors. For a multiplier, at block 402 the synthesizer tool prepares rows of partial products from bits of the inputs ("factors") of the multiplier.

To assist in the explanation of the area optimization algorithm, FIG. 7 shows an example of a multiplier, and FIG. 8 shows rows of partial products generated from the bits of factors A and B of FIG. 7 and the summation of the partial products. The multiplier 452 inputs factors A and B, A is 6 bits wide (bits denoted $a_5a_4a_3a_2a_1a_0$), and B is 5 bits wide (bits denoted $b_4b_3b_2b_1b_0$). The rows of partial products are labeled PP1, PP2, PP3, PP4, and PP5. Bits having 0 values are appended to PP2, PP3, PP4, and PP5 in order to align bits for summing the partial products. PP1 has 6 bits labeled $a_5 \cdot b_0$, $a_4 \cdot b_0$, $a_3 \cdot b_0$, $a_2 \cdot b_0$, $a_1 \cdot b_0$, $a_0 \cdot b_0$, respectively. The 9 bits of the product are labeled, $p_9$, $p_8$, $p_7$, $p_6$, $p_5$, $p_4$, $p_3$, $p_2$, $p_1$, $p_0$, with $p_0$ being the least significant bit (LSB).

Returning now to FIG. 6, at block 404 if two or more of the partial products have constant values, the multiple constant values are combined into a single value by summing the constant values, and the single constant value replaces the two or more rows of partial products in subsequent processing. For example, if PP1, PP2, and PP3 in the example of FIG. 8 are constant values, the constant values are summed (PP1+PP2+PP3) to a single constant value.

At block 406, the synthesis tool determines pairs of the rows of partial products. Referring to FIG. 8, for example, and assuming none of the partial products have a constant value, the row of PP1 can be paired with the row of PP2, the row of PP3 can be paired with PP4, and the row of PP5 can remain unpaired.

Figure 16:
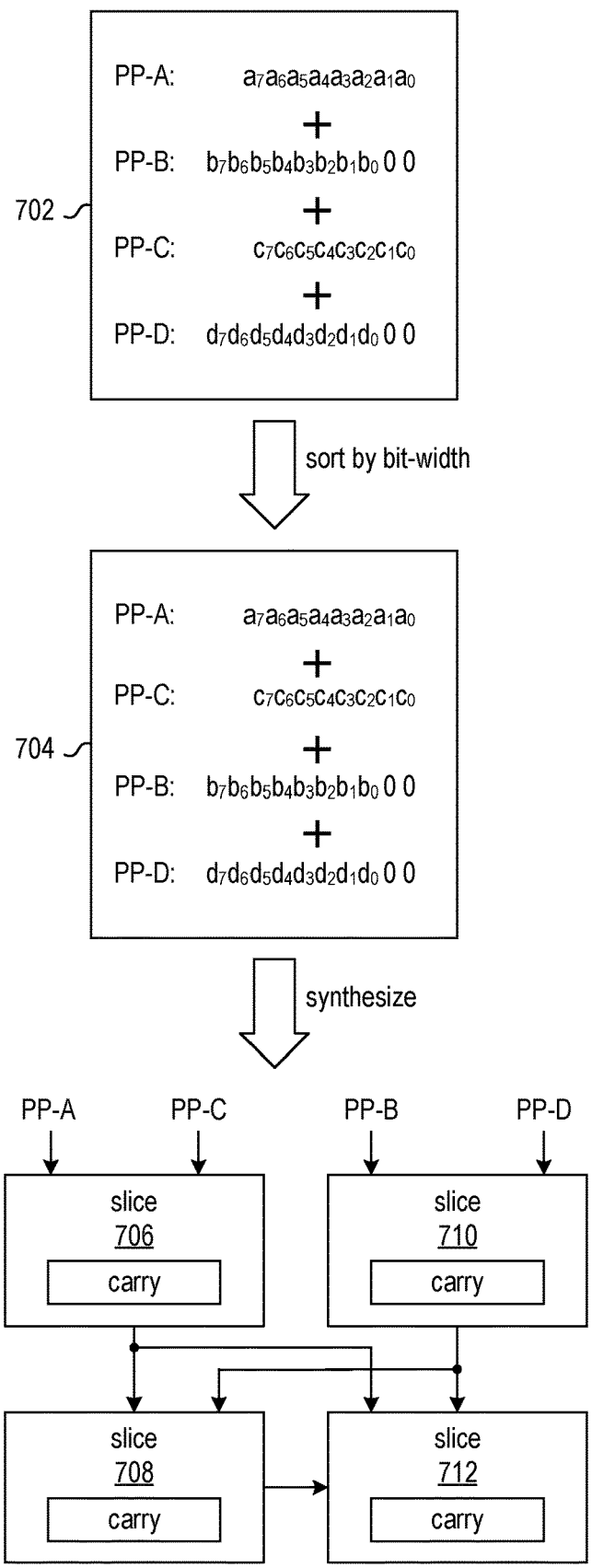
FIG. 16 shows an example in which the rows of partial products are paired by bit-width for area optimization.

According to additional aspects of the synthesis tool, the pairing of rows can be by size (bit-width) of the partial products in order to further optimize use of device resources. According to the disclosed approaches, rows having partial products nearest in size are paired. That is, for P rows of partial products, row J of the P rows having a partial product of bit-width, Jw, is paired with row K of the P rows having a partial product of bit-width, Kw, in response to Kw≥Jw, and (Kw−Jw)≤(Lw−Jw) for all rows L of the P rows other than row K. FIG. 16 shows an example that involves pairing of rows of partial products.

At block 408, for each pair of rows the synthesis tool generates logic that computes an intermediate sum of partial products of the rows of the pair. The logic specifies multiple LUTs and carry logic in a single slice of the programmable IC.

According to additional aspects of the synthesis tool and to further compact the logic, if the bit width of the intermediate sum exceeds the number of bit inputs to the carry logic of a slice by one bit, the LSB of the initial partial product row can be synthesized to be the LSB of the partial intermediate partial product. For example, if the carry logic of a slice has 8-bit inputs and the bit width of the intermediate sum is 9 bits wide, two instances of carry logic in two different slices would be consumed according to speed-optimized synthesis. For area-optimized synthesis, instead of connecting the extra bit to the carry logic of another slice, the LSB of the initial partial product row is specified as the LSB of the intermediate sum.

At decision block 410, the synthesis tool determines whether width of the intermediate sum exceeds the number of bit inputs to the carry logic of a slice by one bit. That is, if the (bit width of the intermediate sum) MOD (number of bit inputs to carry logic)=one bit, then at block 414 the synthesis tool synthesizes the logic as follows. For a number of bit inputs to the carry logic of the single slice being M bits and for a bit width of the intermediate sum of N bits, the synthesis tool connects M−1 bit outputs from the LUTs of the single slice to inputs of the carry logic of that slice, and specifies one bit output other than the M−1 bit outputs as a least significant bit of the intermediate sum.

According to additional aspects of the synthesis tool, if the bit width of the intermediate sum does not exceed the number of bit inputs to the carry logic of a slice by one bit, then at block 412 the LSB of the initial row of partial products is connected to a bit input of the carry logic. The connection is specified in order to cause placement of the LUT that generates the LSB and the carry logic on the same slice. This area optimization is based on the recognition that one row of the pair of rows partial products will have a 0 bit appended to add to the other row. An approach that does not optimize for area specifies the LSB of the non-padded row to be the LSB output of the sum as the bit is to be added to a padded 0 bit of the paired row. Though this approach can reduce the length of the carry chain, the LUT that produces the LSB may be placed on a slice different from the slice having the carry logic that produces the other bits of the intermediate sum. According to the area-optimized approach, the synthesis tool connects the LSB of the initial partial product row to an input of the carry logic, which causes a placer tool to place the LUT and the carry logic on the same slice.

At block 416 the synthesis tool generates logic that accumulates the intermediate sums of the partial products. In generating the logic and in response to the optimization directive specifying area optimization, the synthesis tool avoids LUT-to-LUT connections between LUTs in different slices and infers paired LUTs for ternary adders. Intermediate sums of different pairs of rows of partial products are generated by LUTs and carry logic on different slices, and the intermediate sums can be summed by the LUTs and carry logic of additional slices. In synthesizing logic that sums the intermediate sums, the synthesizer tool can determine whether or not the bit width of the sum exceeds the number of bit inputs to the carry logic by one bit and optimize the logic as explained above for blocks 410, 412, and 414.

Figure 9:
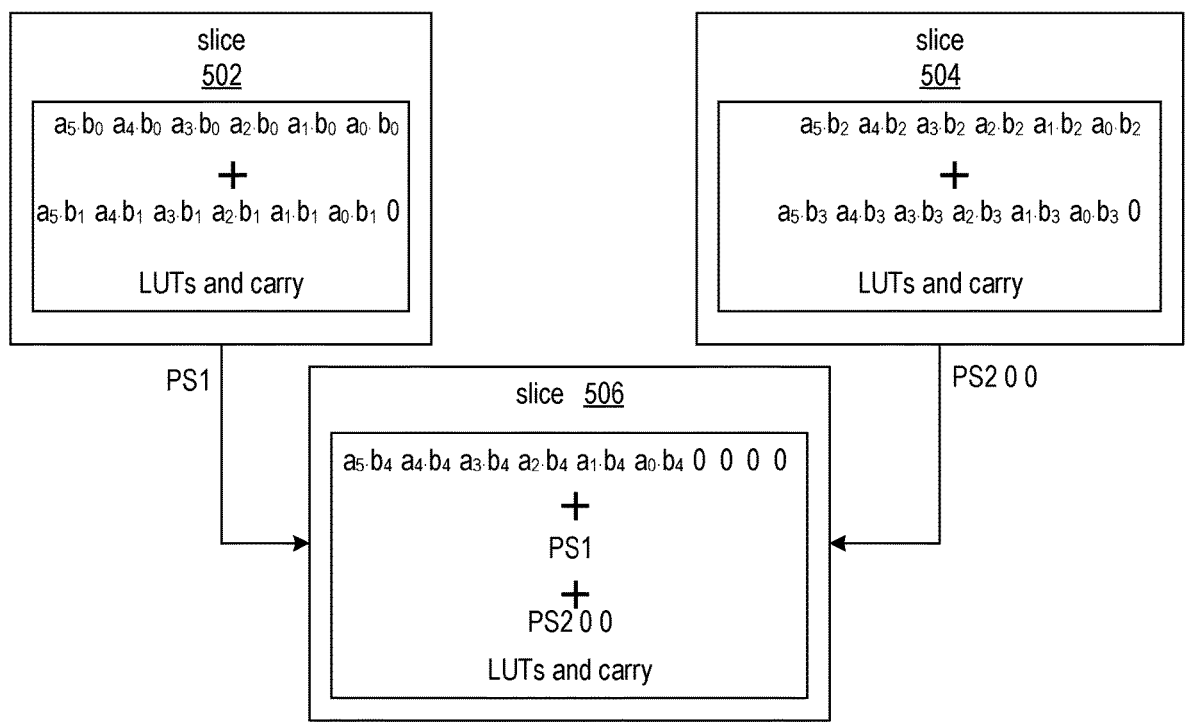
FIG. 9 shows an area-optimized mapping, based on the example of FIG. 8, of multipliers and adders to LUTs and carry logic of slices and pairing rows of partial products and summing the pairs of rows of partial products.

FIG. 9 shows an area-optimized mapping, based on the example of FIG. 8, of multipliers and adders to LUTs and carry logic of slices and pairing rows of partial products and summing the pairs of rows of partial products. The example of FIG. 9 illustrates the pairing of partial product rows, with two partial product rows computed and summed by the LUTs and carry logic of slice 502, and two partial product rows computed and summed by the LUTs and carry logic of slice 504.

The LUTs and carry logic of slice 502 generate the partial sum PS1 (or "intermediate sum") from the partial products $a_5 \cdot b_0$ $a_4 \cdot b_0$ $a_3 \cdot b_0$ $a_2 \cdot b_0$ $a_1 \cdot b_0$ $a_0 \cdot b_0$ and $a_5 \cdot b_1$ $a_4 \cdot b_1$ $a_3 \cdot b_1$ $a_2 \cdot b_1$ $a_1 \cdot b_1$ $a_0 \cdot b_1$ 0. The LUTs and carry logic of slice 504 generate the partial sum PS2 and two appended 0 bits from the partial products $a_5 \cdot b_2$ $a_4 \cdot b_2$ $a_3 \cdot b_2$ $a_2 \cdot b_2$ $a_1 \cdot b_2$ $a_0 \cdot b_2$ and $a_5 \cdot b_3$ $a_4 \cdot b_3$ $a_3 \cdot b_3$ $a_2 \cdot b_3$ $a_1 \cdot b_3$ $a_0 \cdot b_3$ 0. The LUTs and carry logic of slice 506 implement a ternary adder that generates the partial product $a_5 \cdot b_4$ $a_4 \cdot b_4$ $a_3 \cdot b_4$ $a_2 \cdot b_4$ $a_1 \cdot b_4$ $a_0 \cdot b_4$ 0 0 0 0 and sums that partial product with PS1 and PS3 and appended 0 bits.

Figure 10:
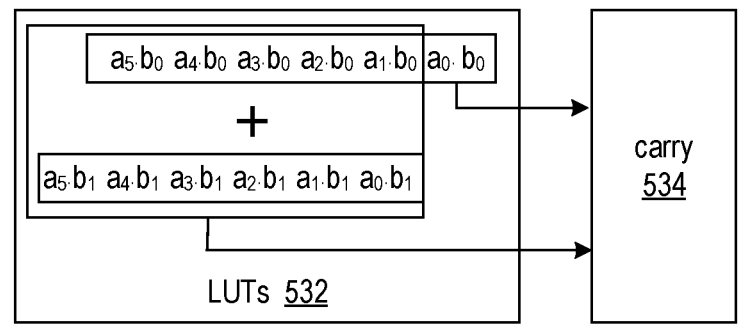
FIG. 10 shows an exemplary area optimization in which the least significant bit (LSB) of the partial product of the first/initial row is connected to an input of the carry logic.

FIG. 10 shows an exemplary area optimization in which the least significant bit (LSB) of the partial product of the first/initial row is connected to an input of the carry logic. The LUTs 532 generate a first partial product of A*B denoted with bits $a_5 \cdot b_0$ $a_4 \cdot b_0$ $a_3 \cdot b_0$ $a_2 \cdot b_0$ $a_1 \cdot b_0$ $a_0 \cdot b_0$ and a second partial product with bits $a_5 \cdot b_1$ $a_4 \cdot b_1$ $a_3 \cdot b_1$ $a_2 \cdot b_1$ $a_1 \cdot b_1$ $a_0 \cdot b_1$. The LUTs sum the 5 MSBs of the first partial product with all the bits of the second partial product to produce an intermediate sum, and the six bits of the intermediate sum are connected to 6 of the inputs of carry logic 534. The LSB of the first partial product ($a_0 \cdot b_0$) is connected to the LSB bit input of the carry logic 534.

Figure 11:
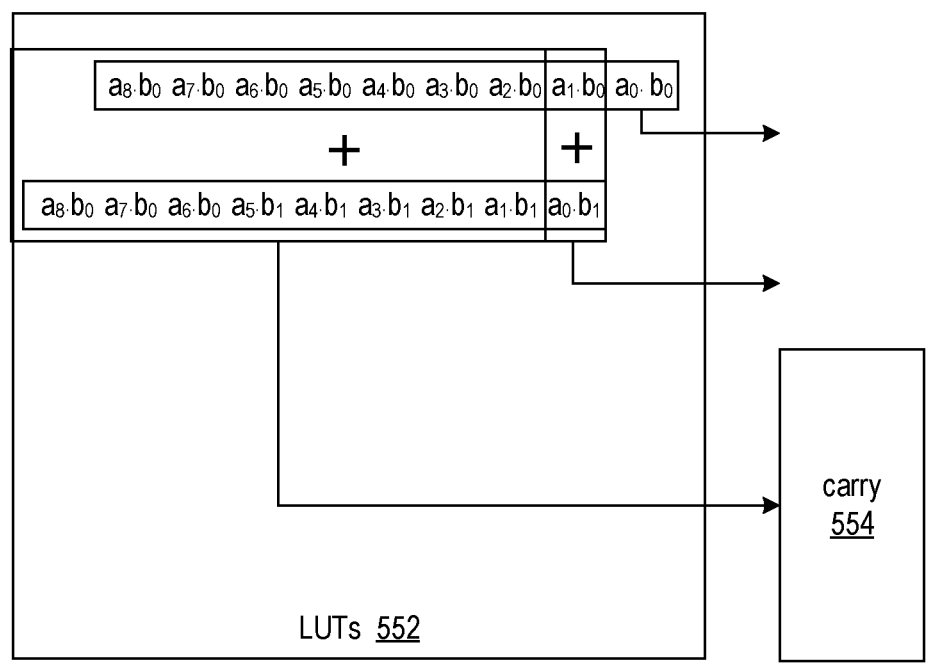
FIG. 11 shows an exemplary area optimization in which the bit-width of the sum of a pair of partial products exceeds the number of inputs to the carry logic by one bit.

FIG. 11 shows an exemplary area optimization in which the bit-width of the sum of a pair of partial products exceeds the number of inputs to the carry logic by one bit. The example of FIG. 11 illustrates a multiplier that multiplies a 9-bit factor by a 2-bit factor.

The LUTs 552 generate a first partial product of A*B denoted with bits $a_8 \cdot b_0$ $a_7 \cdot b_0$ $a_6 \cdot b_0$ $a_5 \cdot b_0$ $a_4 \cdot b_0$ $a_3 \cdot b_0$ $a_2 \cdot b_0$ $a_1 \cdot b_0$ $a_0 \cdot b_0$ and a second partial product with bits $a_8 \cdot b_0$ $a_7 \cdot b_0$ $a_6 \cdot b_0$ $a_5 \cdot b_1$ $a_3 \cdot b_1$ $a_3 \cdot b_1$ $a_2 \cdot b_1$ $a_1 \cdot b_1$ $a_0 \cdot b_1$. The LUTs sum the 8 MSBs of the first partial product with all the bits of the second partial product to produce an intermediate sum. The LSB of the first partial product ($a_0 \cdot b_0$) is output as LSB of the sum of the partial products. As the bit-width of the intermediate sum of $a_8 \cdot b_0$ $a_7 \cdot b_0$ $a_6 \cdot b_0$ $a_5 \cdot b_0$ $a_4 \cdot b_0$ $a_3 \cdot b_0$ $a_2 \cdot b_0$ $a_1 \cdot b_0$ and $a_8 \cdot b_0$ $a_7 \cdot b_0$ $a_6 \cdot b_0$ $a_5 \cdot b_1$ $a_4 \cdot b_1$ $a_3 \cdot b_1$ $a_2 \cdot b_1$ $a_1 \cdot b_1$ $a_0 \cdot b_1$ exceeds the number of bit inputs to the carry logic 554 by one bit, the sum of $a_1 \cdot b_0$ and $a_0 \cdot b_1$ is output as the second LSB of the sum of the partial products and not connected to carry logic. The 8 bits of the intermediate sum of the partial products ($a_8 \cdot b_0$ $a_7 \cdot b_0$ $a_6 \cdot b_0$ $a_5 \cdot b_0$ $a_4 \cdot b_0$ $a_3 \cdot b_0$ $a_2 \cdot b_0+a_8 \cdot b_0$ $a_7 \cdot b_0$ $a_6 \cdot b_0$ $a_5 \cdot b_1$ $a_4 \cdot b_1$ $a_3 \cdot b_1$ $a_2 \cdot b_1$ $a_1 \cdot b_1$) are input to the carry logic 554.

Figure 12:
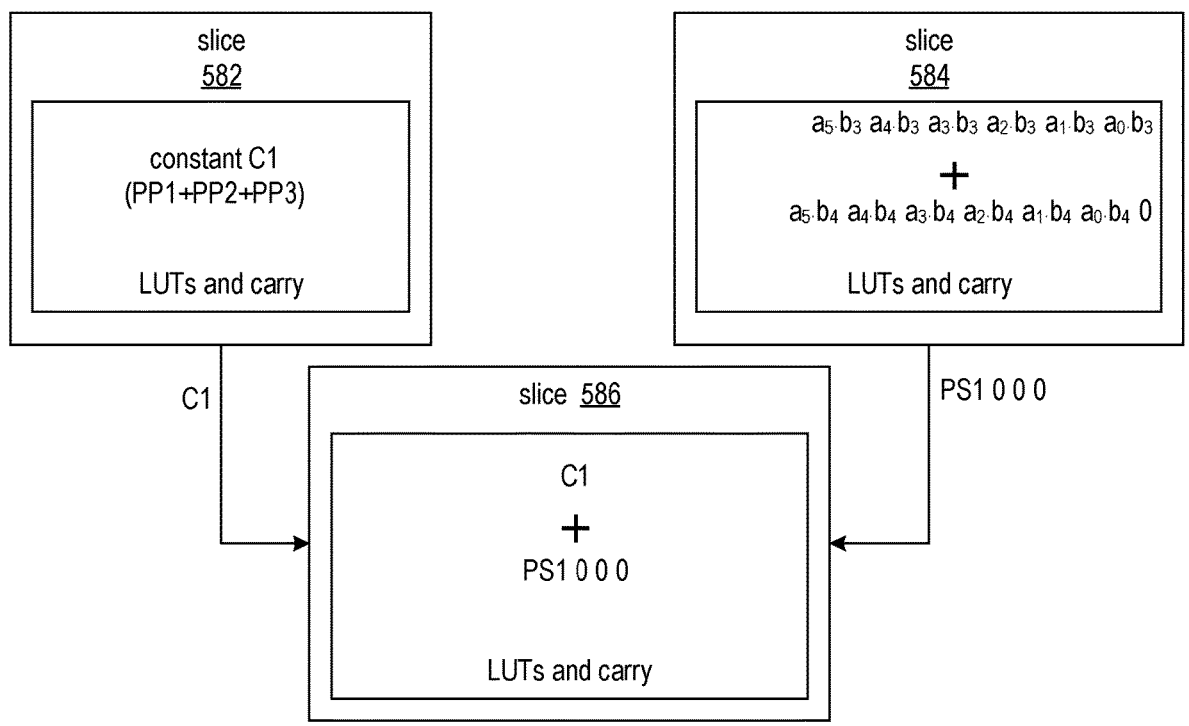
FIG. 12 shows an exemplary area optimization of a multiplier in which two or more of the partial products have constant values.

FIG. 12 shows an exemplary area optimization of a multiplier in which two or more of the partial products have constant values. The synthesizer tool merges the multiple constant values into a single constant value, which can be summed with a partial product or an intermediate sum of other pairs of partial products. In the example of FIG. 8, if partial products PP1, PP2, and PP3 have constant values, the synthesis tool can generate logic for the LUTs and carry logic of slice 582 to output a constant value C1, which is the synthesis-computed value of PP1+PP2+PP3.

The synthesized logic that computes the partial products $a_5 \cdot b_3$ $a_4 \cdot b_3$ $a_3 \cdot b_3$ $a_2 \cdot b_3$ $a_1 \cdot b_3$ $a_0 \cdot b_3$ and $a_5 \cdot b_4$ $a_4 \cdot b_4$ $a_3 \cdot b_4$ $a_2 \cdot b_4$ $a_1 \cdot b_4$ $a_0 \cdot b_4$ 0 and sums the partial products can be mapped to LUTs and carry logic of slice 584. The output of slice 584 is the partial sum PS1 having three zero bits appended. The LUTs and carry logic of slice 586 compute the sum of C1 and PS1 having appended bits "0 0 0."

In another aspect, the disclosed approaches can compact dot product logic. Dot product logic can include small multipliers and adders implemented in LUTs and carry chains, with each multiplier synthesized as the sum of partial products. However, if the netlist of multipliers and adders of dot product logic are generated individually, the netlist might not be optimized in terms of logic packing and resource utilization, because fewer ternary structures may be inferred for packing addition functions into a single slice.

Figure 13:
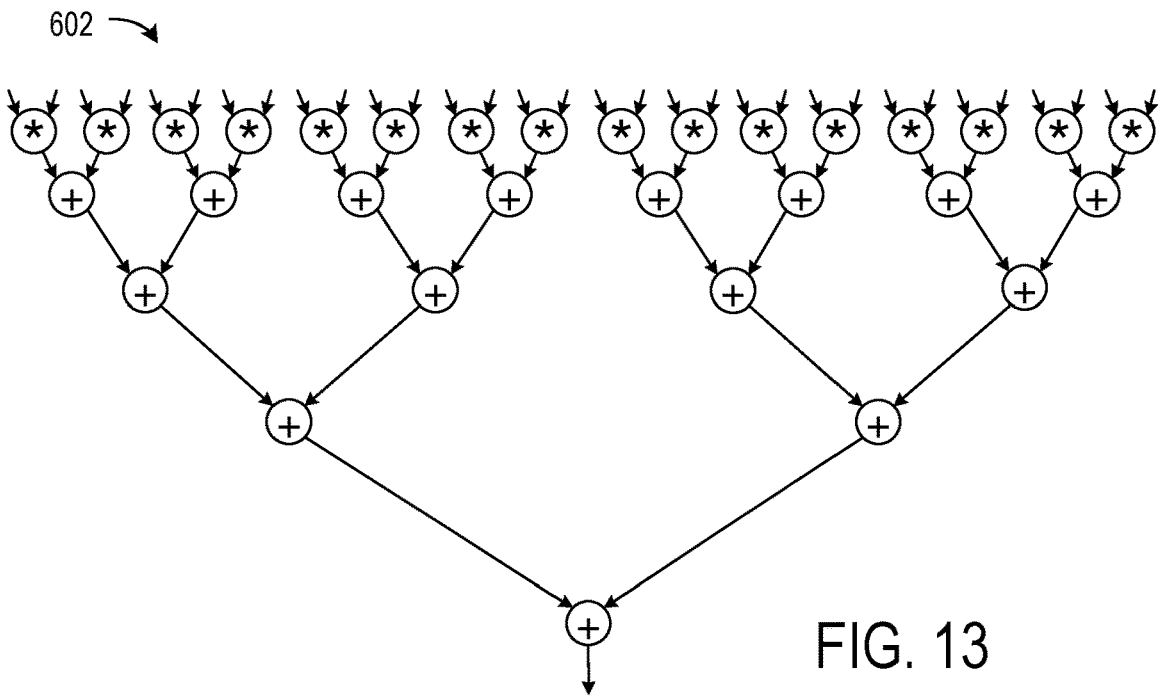
FIG. 13 shows an example specification of dot product logic.
Figure 14:
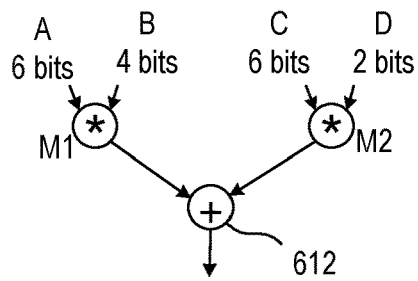
FIG. 14 shows a portion of dot product logic and specific, exemplary factors input to multipliers M1 and M2.

FIG. 13 shows an example specification of dot product logic 602. The exemplary dot product logic has 16 multipliers, and the products from the multipliers are summed by an adder tree. In some applications, the multipliers may input factors having different bit widths. FIG. 14 shows a portion of dot product logic and specific, exemplary factors input to multipliers M1 and M2. Multiplier M1 inputs factors A having 6 bits and B having 4 bits, and multiplier M2 inputs factors C having 6 bits and D having 2 bits. The adder 612 sums the products generated by M1 and M2.

If M1 and M2 were optimized individually without recognizing that the products are part of dot product logic and summed by adder 612, multiplier M1 would be optimized to produce a single summed value of four partial products, multiplier M2 would be optimized to produce a single summed value of two partial products, and the products would be summed by a binary adder. The individual optimization of the multipliers would result in consumption of extra slice(s) to generate the sum of the four partial products for M1. The disclosed approaches recognize that the dot product logic sums the outputs of M1 and M2 and synthesizes the adder into a ternary adder as shown in FIG. 15.

Figure 15:
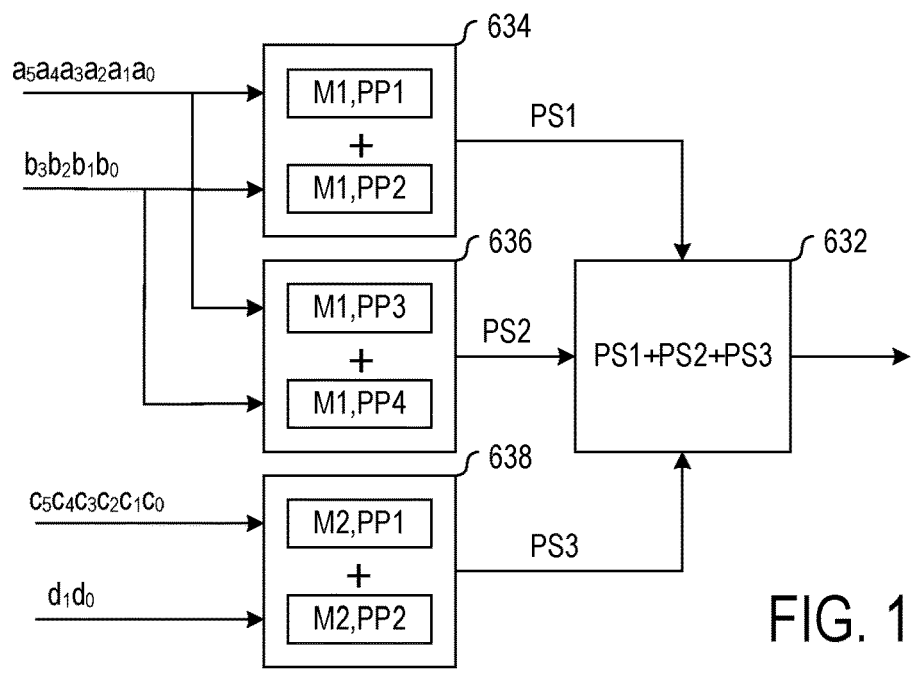
FIG. 15 shows an exemplary area optimization of the example of FIG. 14.

FIG. 15 shows an exemplary area optimization of the example of FIG. 14. The synthesis tool generates a ternary adder 632 that sums partial sums PS1, PS2, and PS3, instead of Instead of generating a binary adder that sums PS1 and PS2 and another binary adder that sums PS3 with the sum of PS1 and PS2.

M1 is reduced to logic that computes four partial products denoted, M1, PP1; M1, PP2; M1, PP3; and M1, PP4. M2 is reduced to two partial products denoted, M2, PP1 and M2, PP2.

The logic that generates the partial products M1, PP1 and M1, PP2 and the partial sum PS1 from the partial products can be synthesized into LUT and carry logic as described above and represented by block 634. The logic that generates the partial products M1, PP3 and M1, PP4 and the partial sum PS2 from the partial products can be synthesized into LUT and carry logic as described above and represented by block 636. The logic that generates the partial products M2, PP1 and M2, PP2 and the partial sum PS3 from the partial products is synthesized into LUT and carry logic as described above and represented by block 638. In an exemplary embodiment, the synthesis tool can generate an adder tree and connect the logic that computes the partial products to the adder tree in a manner that reduces area and resource requirements.

FIG. 16 shows an example in which the rows of partial products are paired by bit-width for area optimization. Partial products of multiplier(s) have different widths. For a single multiplier, initial partial products have smaller bit widths than final partial products due to the appending of zero bits to the final partial products. For a collection of multipliers involved in dot product logic, the partial products of different mutlipliers may have equal bit widths. According to the disclosed approaches, the synthesis tool sorts the partial products by bit width and pairs the partial products by size. Partial products nearest in bit width are paired in order to promote increased utilization of carry logic.

FIG. 16 shows an example of an area optimization applied to four partial products of different widths. Block 702 shows an set of four partial products, denoted PP-A, PP-B, PP-C, and PP-D. PP-A is 8 bits wide, PP-B is 10 bits wide including two appended 0 bits, PP-C is 8 bits wide, and PP-D is 10 bits wide including two appended 0 bits. Block 704 shows the partial products sorted by bit width. Having sorted the partial products, partial products PP-A and PP-C can be paired, and partial products PP-B and PP-D can be paired by the synthesis tool.

Once paired, the synthesis tool can connect the partial products to an adder tree by generating logic that computes the sum of PP-A and PP-C using LUTs and carry logic of slice 706, the sum of PP-B and PP-D using LUTs and carry logic of slice 710, and the total sum using LUTs and carry logic of slices 708 and 712.

Figure 17:
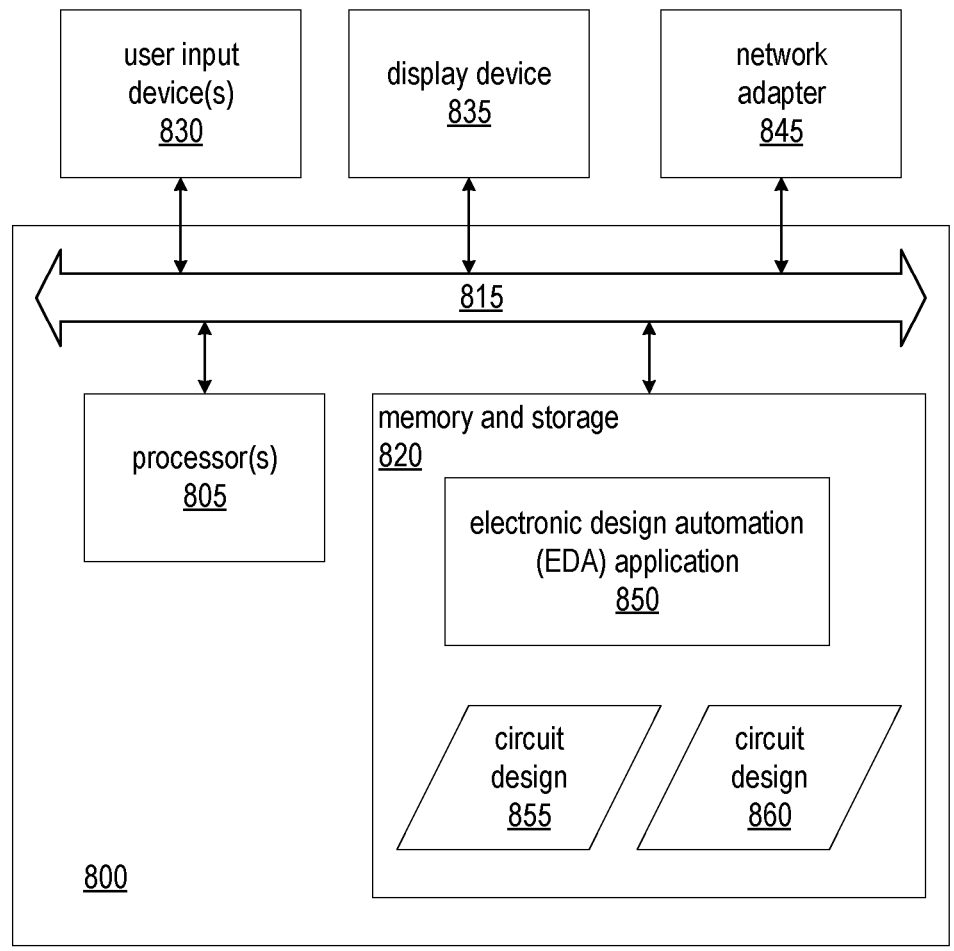
FIG. 17 is a block diagram illustrating an exemplary data processing system.

FIG. 17 is a block diagram illustrating an exemplary data processing system (system) 800. System 800 is an example of an EDA system. As pictured, system 800 includes at least one processor circuit (or "processor"), e.g., a central processing unit (CPU) 805 coupled to memory and storage arrangement 820 through a system bus 815 or other suitable circuitry. System 800 stores program code and circuit design 855 within memory and storage arrangement 820. Processor 805 executes the program code accessed from the memory and storage arrangement 820 via system bus 815. In one aspect, system 800 is implemented as a computer or other data processing system that is suitable for storing and/or executing program code. It should be appreciated, however, that system 800 can be implemented in the form of any system including a processor and memory that is capable of performing the functions described within this disclosure.

Memory and storage arrangement 820 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 800 may also include one or more cache memories (not shown) that provide temporary storage of at least some program code and data in order to reduce the number of times program code and data must be retrieved from local memory and persistent storage during execution.

Input/output (I/O) devices such as user input device(s) 830 and a display device 835 may be optionally coupled to system 800. The I/O devices may be coupled to system 800 either directly or through intervening I/O controllers. A network adapter 845 also can be coupled to system 800 in order to couple system 800 to other systems, computer systems, remote printers, and/or remote storage devices through intervening private or public networks. Modems, cable modems, Ethernet cards, and wireless transceivers are examples of different types of network adapter 845 that can be used with system 800.

Memory and storage arrangement 820 may store an EDA application 850. EDA application 850, being implemented in the form of executable program code, is executed by processor(s) 805. As such, EDA application 850 is considered part of system 800. System 800, while executing EDA application 850, receives and operates on circuit design 855. In one aspect, system 800 performs a design flow on circuit design 855, and the design flow can include synthesis, mapping, placement, routing, and the application of one or more area optimization techniques as described herein. System 800 generates an optimized, or modified, version of circuit design 855 as circuit design 860.

EDA application 850, circuit design 855, circuit design 860, and any data items used, generated, and/or operated upon by EDA application 850 are functional data structures that impart functionality when employed as part of system 800 or when such elements, including derivations and/or modifications thereof, are loaded into an IC such as a programmable IC causing implementation and/or configuration of a circuit design within the programmable IC.

Those skilled in the art will appreciate that various alternative computing arrangements, including one or more processors and a memory arrangement configured with program code, would be suitable for hosting the processes and data structures disclosed herein. In addition, the processes may be provided via a variety of computer-readable storage media or delivery channels such as magnetic or optical disks or tapes, electronic storage devices, or as application services over a network.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for synthesizing circuit design. Other aspects and features will be apparent to those skilled in the art from consideration of the specification. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method comprising:
    inputting an optimization directive that specifies one of area optimization or speed optimization to a synthesis tool executing on a computer processor;
    identifying by the synthesis tool, a multiplier of a first factor and a second factor specified in a circuit design;
    synthesizing the multiplier by the synthesis tool into logic having LUT-to-LUT connections between LUTs on separate slices of a programmable integrated circuit (IC) in response to the optimization directive specifying speed optimization, wherein a LUT is a look-up table; and
    synthesizing the multiplier by the synthesis tool into logic having LUT-carry connections between LUTs and carry logic within a single slice of the programmable IC in response to the optimization directive specifying area optimization, wherein synthesizing the multiplier into logic having LUT-carry connections includes generating, for each pair of a plurality of pairs of partial products of the first factor and the second factor, logic that produces an intermediate sum of the pair on a plurality of LUTs and carry logic in a respective slice of the programmable IC.

2. The method of claim 1, wherein the synthesizing the multiplier into logic having LUT-carry connections includes:
    generating a plurality of rows of partial products that sum to a product of the first factor and the second factor of the multiplier; and
    determining the pairs of the plurality of pairs from the plurality of rows.

3. The method of claim 2, further comprising, generating by the synthesis tool for a first pair and a second pair of the plurality of rows, logic that specifies a sum of outputs from the carry logic of the first pair and the carry logic of the second pair on a plurality of LUTs and carry logic in another single slice of the programmable IC.

4. The method of claim 2, wherein:
    a partial product of an initial row of the plurality of rows has a least significant bit of the product of the first factor and the second factor; and
    the synthesizing the multiplier into logic having LUT-carry connections includes assigning the least significant bit of the partial product of the initial row to an input of the carry logic of the slice that specifies the intermediate sum of the initial row and another row of the plurality of rows paired with the initial row.

5. The method of claim 2, wherein the synthesizing the multiplier into logic having LUT-carry connections includes:
    determining for a number of bit inputs to the carry logic of the single slice=M bits and for a bit width of the intermediate sum=N bits, that N MOD M=1 bit;
    connecting M−1 bit outputs from the plurality of LUTs of the single slice to inputs of the carry logic of the single slice; and
    specifying 1 bit output other than the M−1 bit outputs from the plurality of LUTs of the single slice as a least significant bit of a sum of a first row and a second row of each pair of the pairs of rows.

6. The method of claim 2, wherein:
    the synthesizing the multiplier into logic having LUT-carry connections includes:
        determining that partial products of two or more rows of the plurality of rows of partial products have constant values, and
        combining the constant values of the partial products of the two or more rows into a single constant value; and
    determining the pairs of rows of the plurality of rows includes replacing the two or more rows with a single row having the single constant value.

7. The method of claim 2, wherein determining the pairs of rows of the plurality of rows includes, for the plurality of rows including P rows, pairing row J of the P rows having a partial product of bit-width, Jw, with row K of the P rows having a partial product of bit-width, Kw, in response to Kw≥Jw, and (Kw−Jw)≤(Lw−Jw) for all rows L of the P rows other than row K.

8. The method of claim 1, further comprising in response to the optimization directive specifying area optimization:
    identifying a dot product function specified in the circuit design by the synthesis tool;
    generating for each multiplication of the dot product, logic that computes partial products that sum to a product of a first term and a second term of the multiplication; and
    generating an adder tree and connecting the logic that computes the partial products to the adder tree.

9. The method of claim 8, wherein:
    generating the logic for each multiplication includes:
        generating a plurality of rows of partial products that sum to a product of the first term and the second term,
        determining pairs of rows of the plurality of rows; and
        determining the pairs of rows of the plurality of rows includes, for the plurality of rows including P rows, pairing row J of the P rows having a partial product of bit-width, Jw, with row K of the P rows having a partial product of bit-width, Kw, in response to Kw≥Jw, and (Kw−Jw)≤(Lw−Jw) for all rows L of the P rows other than row K.

10. The method of claim 1, further comprising:
    identifying a ternary adder specified in the circuit design by the synthesis tool;
    forming LUT pairs by the synthesis tool to perform addition of the ternary adder;
    un-pairing the LUT pairs by the synthesis tool in response to the optimization directive specifying area optimization;

leaving intact the LUT pairs by the synthesis tool in response to the optimization directive specifying speed optimization; and implementing a circuit on the programmable IC from the logic having the LUT pairs in response to the optimization directive specifying area optimization.

11. A system comprising:

one or more processors;

a memory arrangement configured with instructions of a synthesis tool that when executed by the one or more processors cause the one or more processors to perform operations including:

inputting an optimization directive that specifies one of area optimization or speed optimization;

identifying a multiplier of a first factor and a second factor specified in a circuit design;

synthesizing the multiplier into logic having LUT-to-LUT connections between LUTs on separate slices of a programmable integrated circuit (IC) in response to the optimization directive specifying speed optimization, wherein a LUT is a look-up table; and synthesizing the multiplier into logic having LUT-carry connections between LUTs and carry logic within a single slice of the programmable IC in response to the optimization directive specifying area optimization, wherein synthesizing the multiplier into logic having LUT-carry connections includes generating, for each pair of a plurality of pairs of partial products of the first factor and the second factor, logic that produces an intermediate sum of the pair on a plurality of LUTs and carry logic in a respective slice of the programmable IC.

12. The system of claim 11, wherein the instructions for synthesizing the multiplier into logic having LUT-carry connections include instructions for:

generating a plurality of rows of partial products that sum to a product of the first factor and the second factor of the multiplier; and determining the pairs of the plurality of pairs from the plurality of rows.

13. The system of claim 12, wherein the memory arrangement is further configured with instructions that when executed cause the one or more processors to generate for a first pair and a second pair of the plurality of rows, logic that specifies a sum of outputs from the carry logic of the first pair and the carry logic of the second pair on a plurality of LUTs and carry logic in another single slice of the programmable IC.

14. The system of claim 12, wherein:

a partial product of an initial row of the plurality of rows has a least significant bit of the product of the first factor and the second factor; and the instructions for synthesizing the multiplier into logic having LUT-carry connections include instructions for assigning the least significant bit of the partial product of the initial row to an input of the carry logic of the slice that specifies the intermediate sum of the initial row and another row of the plurality of rows paired with the initial row.

15. The system of claim 12, wherein the instructions for synthesizing the multiplier into logic having LUT-carry connections include instructions for:

determining for a number of bit inputs to the carry logic of the single slice=M bits and for a bit width of the intermediate sum=N bits, that N MOD M=1 bit;

connecting M−1 bit outputs from the plurality of LUTs of the single slice to inputs of the carry logic of the single slice; and specifying 1 bit output other than the M−1 bit outputs from the plurality of LUTs of the single slice as a least significant bit of a sum of a first row and a second row of each pair of the pairs of rows.

16. The system of claim 12, wherein:

the instructions for synthesizing the multiplier into logic having LUT-carry connections include instructions for:

determining that partial products of two or more rows of the plurality of rows of partial products have constant values, and combining the constant values of the partial products of the two or more rows into a single constant value; and the instructions for determining the pairs of rows of the plurality of rows include instructions for replacing the two or more rows with a single row having the single constant value.

17. The system of claim 12, wherein the instructions for determining pairs of rows of the plurality of rows include, for the plurality of rows including P rows, instructions for pairing row J of the P rows having a partial product of bit-width, Jw, with row K of the P rows having a partial product of bit-width, Kw, in response to Kw≥Jw, and (Kw−Jw)≤(Lw−Jw) for all rows L of the P rows other than row K.

18. The system of claim 11, wherein the memory arrangement is further configured with instructions that when executed cause the one or more processors to, in response to the optimization directive specifying area optimization:

identify a dot product function specified in the circuit design;

generate for each multiplication of the dot product, logic that computes partial products that sum to a product of a first term and a second term of the multiplication; and generate an adder tree and connecting the logic that computes the partial products to the adder tree.

19. The system of claim 18, wherein:

the instructions for generating the logic for each multiplication include instructions for:

generating a plurality of rows of partial products that sum to a product of the first term and the second term of the multiplier, determining pairs of rows of the plurality of rows; and the instructions for determining pairs of rows of the plurality of rows include, for the plurality of rows including P rows, instructions for pairing row J of the P rows having a partial product of bit-width, Jw, with row K of the P rows having a partial product of bit-width, Kw, in response to Kw≥Jw, and (Kw−Jw)≤ (Lw−Jw) for all rows L of the P rows other than row K.

20. The system of claim 11, wherein the memory arrangement is further configured with instructions that when executed cause the one or more processors to:

identify a ternary adder specified in the circuit design;

form LUT pairs by the synthesis tool to perform addition of the ternary adder;

un-pair the LUT pairs in response to the optimization directive specifying area optimization;

leave intact the LUT pairs in response to the optimization directive specifying speed optimization; and implement a circuit on the programmable IC from the logic having the LUT pairs in response to the optimization directive specifying area optimization.

* * * * *